(12) United States Patent
Takeya et al.

(10) Patent No.: US 11,605,755 B2
(45) Date of Patent: *Mar. 14, 2023

(54) DISPLAY DEVICE, SUBSTRATE FOR DISPLAY DEVICE AND METHOD FOR REPAIRING DISPLAY DEVICE

(71) Applicant: Seoul Semiconductor Co., Ltd., Ansan-si (KR)

(72) Inventors: Motonobu Takeya, Ansan-si (KR); Sung Su Son, Ansan-si (KR); Seung Sik Hong, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 29 days.

This patent is subject to a terminal disclaimer.

(21) Appl. No.: 17/363,014

(22) Filed: Jun. 30, 2021

(65) Prior Publication Data

US 2021/0328098 A1 Oct. 21, 2021

Related U.S. Application Data

(63) Continuation of application No. 16/635,717, filed as application No. PCT/KR2018/008732 on Aug. 1, 2018, now Pat. No. 11,063,175.

(30) Foreign Application Priority Data

Aug. 2, 2017 (KR) .......................... 10-2017-0098212

(51) Int. Cl.
*H01L 33/00* (2010.01)
*H01L 21/66* (2006.01)
(Continued)

(52) U.S. Cl.
CPC .......... *H01L 33/0095* (2013.01); *H01L 22/22* (2013.01); *H01L 25/0753* (2013.01); *H01L 33/62* (2013.01); *H01L 2933/0066* (2013.01)

(58) Field of Classification Search
CPC combination set(s) only.
See application file for complete search history.

(56) References Cited

U.S. PATENT DOCUMENTS 6,495,397 B2   12/2002   Kubota et al.
6,518,093 B1   2/2003   Nakamikawa
(Continued)

FOREIGN PATENT DOCUMENTS

CN   105023522   11/2015
EP   2889856   7/2015
(Continued)

OTHER PUBLICATIONS

Office Action dated Aug. 2, 2022 from the Japanese Patent Office for Japanese Patent Application No. 2020-505413 (with English Translation).

(Continued)

*Primary Examiner* — Ratisha Mehta
(74) *Attorney, Agent, or Firm* — H.C. Park & Associates, PLC (57) ABSTRACT

A display including a base, a plurality of pixels disposed on the base in rows and columns, at least one of the pixels including a first interconnect and a plurality of second interconnects, and a plurality of mounting portions on which a plurality of sub-pixels is to be mounted, in which a first portion of each of the plurality of mounting portions is electrically connected to the first interconnect, a second portion of each of the plurality of mounting portions is electrically connected to one of the second interconnects, and at least one of the plurality of sub-pixels mounted on the plurality of mounting portions is configured to emit light of different wavelength.

15 Claims, 9 Drawing Sheets (51) Int. Cl.
*H01L 25/075* (2006.01)
*H01L 33/62* (2010.01)

(56) References Cited

U.S. PATENT DOCUMENTS

| | | | |
|---|---|---|---|
| 6,546,620 | B1 | 4/2003 | Juskey et al. |
| 8,184,075 | B2 | 5/2012 | Sagawa et al. |
| 9,196,635 | B2* | 11/2015 | Itoh .................... G02F 1/136259 |
| 9,552,756 | B2 | 1/2017 | Tani et al. |
| 9,721,501 | B2 | 8/2017 | Cho et al. |
| 10,878,733 | B2 | 12/2020 | Hughes et al. |
| 2002/0033525 | A1 | 3/2002 | Ohuchi |
| 2006/0228878 | A1 | 10/2006 | Park et al. |
| 2007/0252146 | A1 | 11/2007 | Yokomizo |
| 2009/0115708 | A1 | 5/2009 | Sagawa et al. |
| 2015/0187249 | A1 | 7/2015 | Tani et al. |
| 2015/0294620 | A1 | 10/2015 | Cho et al. |
| 2015/0371585 | A1 | 12/2015 | Bower et al. |
| 2016/0351092 | A1 | 12/2016 | Chen et al. |
| 2017/0102797 | A1* | 4/2017 | Cok .................... H01L 25/167 |
| 2019/0027075 | A1 | 1/2019 | Hughes et al. |

FOREIGN PATENT DOCUMENTS

| | | |
|---|---|---|
| GB | 2541970 | 3/2017 |
| GB | 02541970 | 3/2017 |
| JP | 01302829 | 12/1989 |
| JP | 06120417 | 4/1994 |
| JP | 08-153832 | 6/1996 |
| JP | 09307225 | 11/1997 |
| JP | 2001-094003 | 4/2001 |
| JP | 2002-118209 | 4/2002 |
| JP | 2005-500672 | 1/2005 |
| JP | 2007-156338 | 6/2007 |
| JP | 2009-134233 | 6/2009 |
| JP | 2016-512347 | 4/2016 |
| KR | 10-2007-0106931 | 11/2007 |
| KR | 10-2015-0080949 | 7/2015 |
| KR | 10-2015-0118257 | 10/2015 |

OTHER PUBLICATIONS

International Search Report dated Nov. 15, 2018, in International Patent Application No. PCT/KR2018/008732 (with English Translation).

Extended European Search Report dated Mar. 23, 2021, issued in European Patent Application No. 18842262.

Notice of Allowance dated Apr. 1, 2021, in U.S. Appl. No. 16/635,717.

Notice of Allowance dated May 21, 2021, in U.S. Appl. No. 16/635,717.

* cited by examiner

DISPLAY DEVICE, SUBSTRATE FOR DISPLAY DEVICE AND METHOD FOR REPAIRING DISPLAY DEVICE

CROSS-REFERENCE TO RELATED APPLICATIONS

This application is a Continuation of U.S. patent application Ser. No. 16/635,717, filed on Jan. 31, 2020, which is a National Stage Entry of International Application No. PCT/KR2018/008732, filed on Aug. 1, 2018, and claims priority from and the benefit of Korean Patent Application No. 10-2017-0098212, filed on Aug. 2, 2017, each of which are hereby incorporated by reference for all purposes as if fully set forth herein.

BACKGROUND

Field

Exemplary embodiments relate to a display, a substrate for the display, and a method for repairing the display, and more particularly, to a substrate for a display using a light emitting diode chip, and a method for repairing the display.

Discussion of the Background

A light emitting diode is an inorganic semiconductor device that emits light generated through recombination of electrons and holes. Recently, light emitting diodes have been used in various technical fields, such as displays, vehicle lamps, and general lighting devices. In addition, light emitting diodes have advantages of longer lifespan, lower power consumption, and faster response speed than conventional light sources, and thus, are rapidly replacing the conventional existing light sources.

The above information disclosed in this Background section is only for understanding of the background of the inventive concepts, and, therefore, it may contain information that does not constitute prior art.

SUMMARY

Display devices constructed according to exemplary embodiments of the invention are capable of being easily repaired when a problem occurs in a light emitting diode chip therein, a substrate for the display, and a method for repairing the display.

Exemplary embodiments also provide a substrate for an LED-based display using a large number of LED chips, which facilitates a repair process of replacing any defective LED chip in the display.

Additional features of the inventive concepts will be set forth in the description which follows, and in part will be apparent from the description, or may be learned by practice of the inventive concepts.

A substrate for a display according to an exemplary embodiment includes a base, a plurality of first interconnects disposed on the base, a plurality of second interconnects disposed on the base to intersect with the first interconnects, and a plurality of sub-pixels formed on the base and including one or more of the first and second interconnects, each of the sub-pixels including at least one interconnect extension protruding from at least one side of the second interconnect, first and second mounting portions formed between the at least one interconnect extension and the first interconnect, and a light emitting diode mounted on the first mounting portion, in which the second mounting portion is configured to mount another light emitting diode thereon.

The second mounting portion may be symmetrical to the first mounting portion with respect to the second interconnect.

The light emitting diode may be mounted on the first mounting portion via a first adhesive and the another light emitting diode may be mounted on the second mounting portion via a second adhesive, in which the second adhesive may have a lower melting point than the first adhesive.

In any one of the sub-pixels formed on the base, the light emitting diode may be mounted only on the first mounting portion.

In any one of the sub-pixels formed on the base, the another light emitting diode may be mounted only on the second mounting portion.

In any one of the sub-pixels formed on the base, the light emitting diode and the another light emitting diode may be respectively mounted on the first mounting portion and the second mounting portion.

Each of the first mounting portion and the second mounting portion may include a first substrate electrode electrically connected to the first interconnect, and a second substrate electrode electrically connected to the interconnect extension, and the light emitting diode may be mounted on any one of the first mounting portion and the second mounting portion to be electrically connected to the first and second substrate electrodes.

A substrate for a display according to another exemplary embodiment includes a base, a plurality of first interconnects disposed on the base, a plurality of second interconnects disposed on the base to intersect with the first interconnects, an interconnect extension extending from one side of each of the second interconnects, a first mounting portion connected to the interconnect extension, a disconnected interconnect disposed in each interval of the second interconnects, a second mounting portion connected to the disconnected interconnect, and a light emitting diode mounted on at least one of the first mounting portions, in which the disconnected interconnects are spaced apart from the second interconnects, and the second mounting portion is configured to mount another light emitting diode thereon.

The substrate may further include an interconnect connection electrically connecting the second interconnect to the disconnected interconnect of the second mounting portion with the another light emitting diode mounted thereon.

The disconnected interconnect may be disposed in the middle of each interval of the second interconnects.

A method for repairing a display including a substrate including a plurality of first interconnects, a plurality of second interconnects intersecting with the first interconnects, a plurality of sub-pixels, and first and second mounting portions formed in each sub-pixel and configured to mount a light emitting diode thereon, according to yet another exemplary embodiment includes the steps of: mounting light emitting diodes on respective first mounting portions using a first adhesive; testing whether the light emitting diodes mounted on the respective first mounting portions are defective; and mounting a separate light emitting diode on the second mounting portion using a second adhesive to replace a defective light emitting diode among the light emitting diodes mounted on the respective first mounting portions, in which the second adhesive has a lower melting point than the first adhesive.

The steps may further include electrically disconnecting the defective light emitting diode from other components by removing the defective light emitting diode from the first mounting portion.

The light emitting diodes may be mounted on the respective first mounting portions with the first adhesive applied to the light emitting diodes.

The light emitting diodes may be mounted on the respective first mounting portions with the first adhesive applied to the first mounting portions.

Each of the first and second adhesives may include at least one of AuSn, AgSn, Sn, InAu, and In.

The steps may further include electrically connecting the second mounting portion to one of the second interconnects.

A display may include a substrate according to an exemplary embodiment and a plurality of light emitting diodes disposed on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Recent displays, such as televisions, monitors, and electronic displays, mainly employ light emitting diodes. Typical liquid crystal displays reproduce colors using a TFT-LCD panel, and emit the reproduced colors using a backlight source. In this case, a light emitting diode is generally used as the backlight source. In addition, research on a display that directly reproduces colors using a light emitting diode without any separate LCD has been continuously conducted. Further, there are displays manufactured using OLEDs.

When a light emitting diode is used as a backlight source for a TFT-LCD panel, one light emitting diode is used as a light source for illuminating a large number of pixels of the TFT-LCD panel. As such, regardless of what color is displayed on a screen of the TFT-LCD panel, the backlight light source may need to be turned on at all times, which may consume constant power whether the displayed screen is bright or dark.

Despite continuous reduction in power consumption through technological development, OLED-based displays consume a relatively large amount of power, as compared with displays using a light emitting diode, which is an inorganic semiconductor device, thereby causing reduction in efficiency.

In addition, an OLED-based display employing a passive matrix (PM) driving to drive TFTs generally uses pulse amplitude modulation (PAM) to control a large-capacity organic electroluminescence (EL), which may lower response speed. Further, controlling the organic EL based on pulse width modulation (PWM) to achieve low duty-cycle operations requires high-current driving, causing reduction in lifespan of the OLED display.

Figure 1:
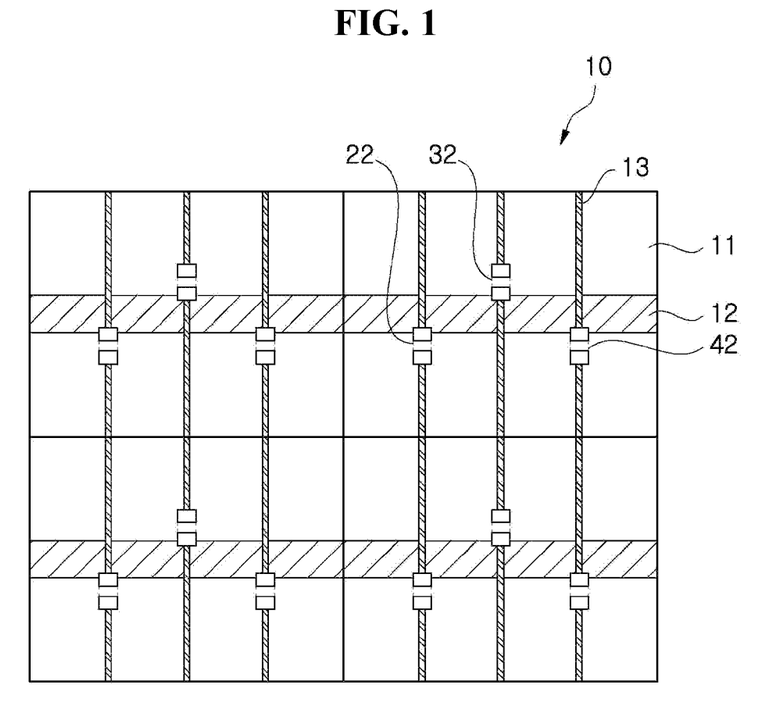
FIG. 1 is a plan view of a typical substrate for a display.

FIG. 1 is a plan view of a typical substrate for a display.

Referring to FIG. 1, a typical substrate 10 used in implementing an LED-based display may include horizontal interconnects 12, vertical interconnects 13, and mounting portions 22, 32, 42 formed on first and second interconnects each being adapted to mount a light emitting diode chip thereon. More particularly, each pixel includes at least three mounting portions 22, 32, 42 thereon, which may include a blue chip mounting portion adapted to mount a blue light emitting diode chip thereon, a green chip mounting portion adapted to mount a green light emitting diode chip thereon, and a red chip mounting portion adapted to mount a red light emitting diode chip thereon.

Accordingly, the blue light emitting diode chip, the green light emitting diode chip, and the red light emitting diode chip may be mounted on the blue chip mounting portion, the green chip mounting portion, and the red chip mounting portion, respectively.

If a problem occurs in any of the light emitting diode chips mounted on the pixel, a repair process may be performed by removing the defective light emitting diode chip and mounting a separate light emitting diode chip that functions normally at the location where the defective light emitting diode chip has been removed. Upon removing the defective light emitting diode chip, a previously applied adhesive may be partially remained on the substrate. An adhesive residue retained at the location, to which the separate light emitting diode chip is to be mounted, can cause another problem from contamination and the like. As such, the adhesive residue at a corresponding mounting portion may need to be completely removed before mounting the separate light emitting diode chip on the mounting portion. However, such process requires much time and costs.

In addition, mounting more light emitting diode chips than required for a pixel in advance may be an easy way of curing a problem with a light emitting diode chip. In particular, even when one blue light emitting diode chip, one green light emitting diode chip, and one red light emitting diode chip are sufficient for one pixel, two or more of each of the light emitting diode chips may be mounted in advance in the pixel. In this case, only one of the two or more light emitting diode chips may be set to emit light. If a defect occurs in any of the light emitting diode chips mounted in a pixel, the defective light emitting diode chip may be electrically disconnected from other components and the surplus light emitting diode chip of the same kind, which was previously mounted in the pixel but not being used, may be electrically connected as a repairing process.

However, despite being a simple and easy solution, mounting surplus light emitting diode chips requires a large number of light emitting diode chips, at least twice as many as required for a display, thereby significant increasing manufacturing costs.

Figure 2:
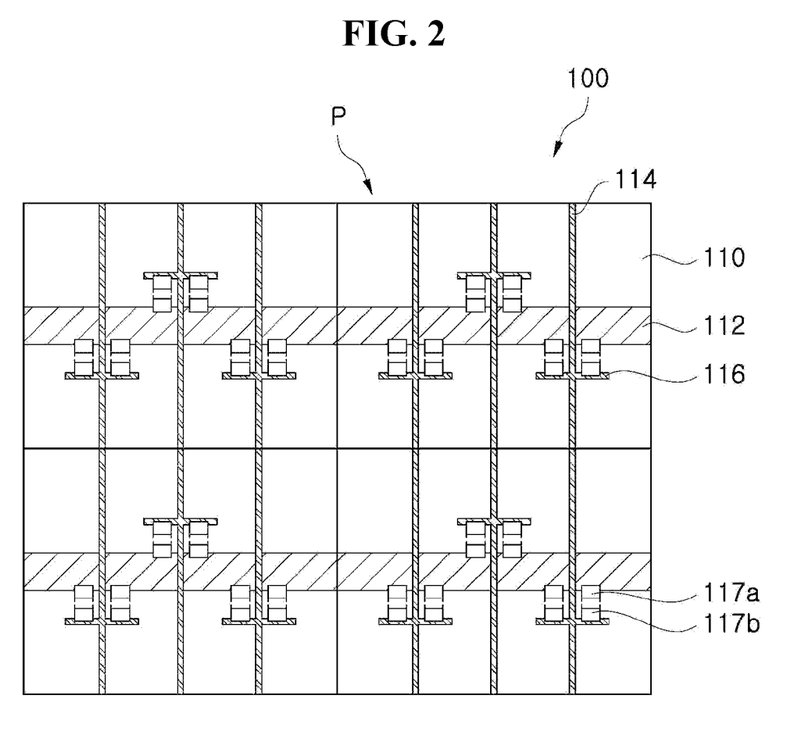
FIG. 2 is a plan view of a substrate for a display according to a first exemplary embodiment.

FIG. 2 is a plan view of a substrate for a display according to a first exemplary embodiment.

Figure 5:
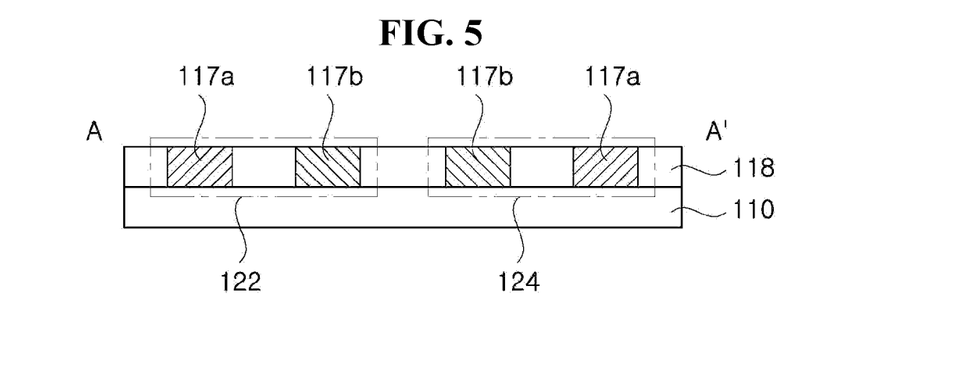
FIG. 5 is a cross-sectional view taken along line A-A' of FIG. 3.

Referring to FIG. 2, a substrate 110 for a display 100 according to a first exemplary embodiment includes horizontal interconnects 112, vertical interconnects 114, interconnect extensions 116, first substrate electrodes 117a, second substrate electrodes 117b, and insulating portions 118 (see FIG. 5). FIG. 2 shows a portion of the substrate 110 with multiple pixels P formed thereon.

The substrate 110 supports light emitting diodes of the display 100. In the illustrated exemplary embodiment, the substrate 110 may have a base formed of an insulating material and having a predetermined thickness. The horizontal interconnects 112, the vertical interconnects 114, the interconnect extensions 116, the first substrate electrodes 117a, and the second substrate electrodes 117b may be formed on the base of the substrate 110.

The horizontal interconnects 112 and the vertical interconnects 114 are used to transmit electric power and image signals to light emitting diode chips mounted on the substrate 110.

As shown in FIG. 2, the horizontal interconnects 112 are horizontally disposed on the substrate 110 and vertically spaced apart from one another at predetermined intervals. One horizontal interconnect 112 may be disposed along a line of pixels P horizontally formed on the substrate 110. For example, when multiple pixels P are formed in columns and rows on the substrate 110, the number of horizontal interconnects 112 may be the same as the number of rows of the pixels P.

As shown in FIG. 2, the vertical interconnects 114 are vertically disposed on the substrate 110 and horizontally spaced apart from one another at predetermined intervals. Referring to FIG. 2, three vertical interconnects 114 may be disposed along a line of pixels P vertically formed on the substrate 110, such that each pixel P is provided with three vertical interconnects 114.

The interconnect extensions 116 are disposed on the substrate 110 and laterally protrude from the respective vertical interconnects 114. In the illustrated exemplary embodiment, two interconnect extensions 116 equidistantly protrude from opposite sides of one vertical interconnect 114, respectively. However, the inventive concepts are not limited thereto, and in some exemplary embodiments, the two interconnect extensions 116 may protrude different distances from the opposite sides of the vertical interconnect 114, respectively. The interconnect extension 116 protruding from one vertical interconnect 114 has a length so as not to reach other neighboring vertical interconnects 114.

Figure 3:
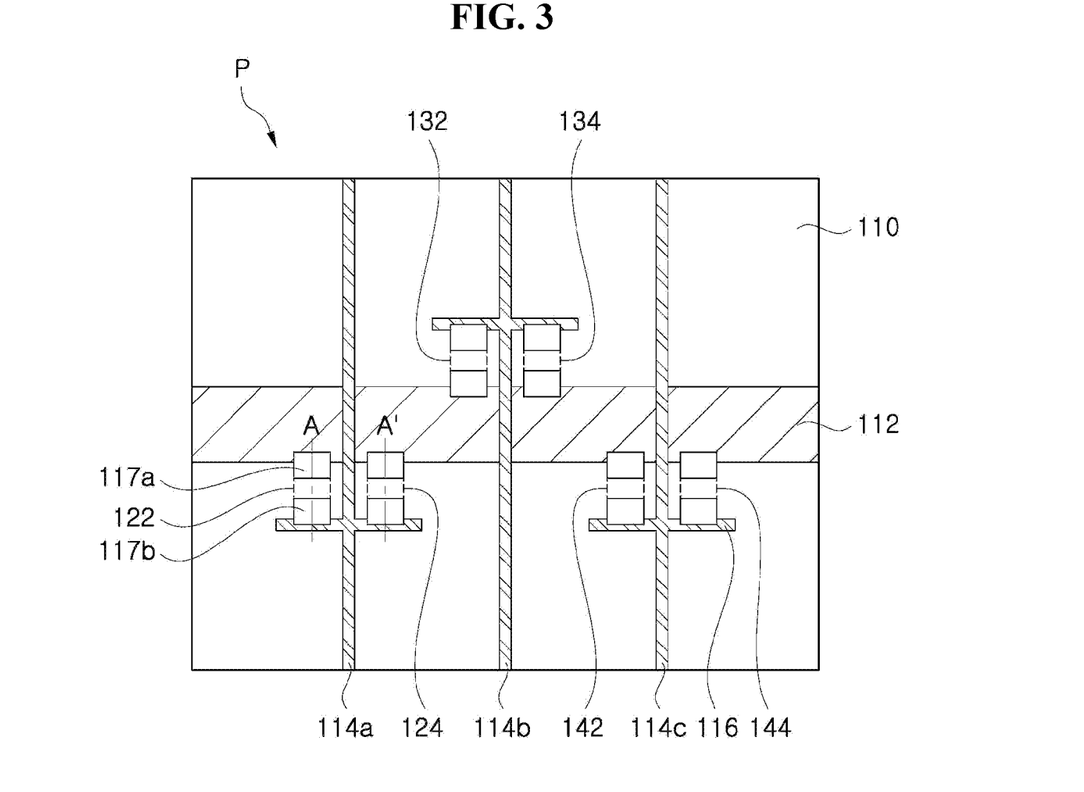
FIG. 3 is a plan view of one pixel of the substrate for the display of FIG. 1.
Figure 4:
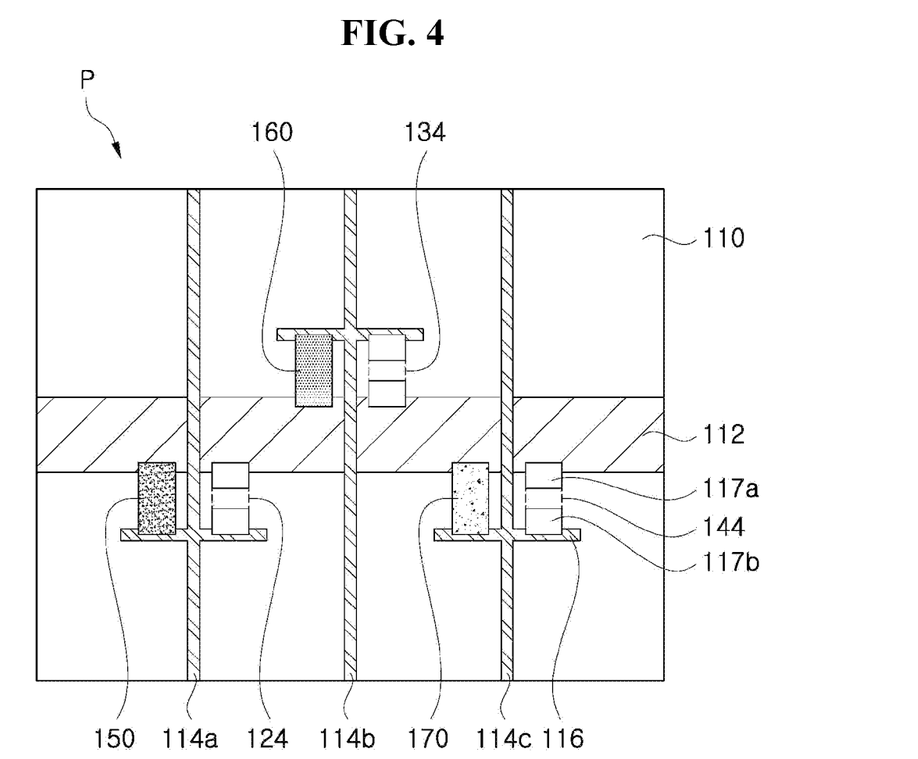
FIG. 4 is a plan view of the substrate for the display of FIG. 1 with light emitting diode chips mounted thereon.

FIG. 3 is a plan view of one pixel of the substrate for the display of FIG. 2, and FIG. 4 is a plan view of the substrate for the display of FIG. 2, with light emitting diode chips mounted thereon. FIG. 5 is a cross-sectional view taken along line AA' of FIG. 3.

As described above, in each pixel, one horizontal interconnect 112 is horizontally disposed and three vertical interconnects 114a, 114b, 114c are vertically disposed. In addition, two interconnect extensions 116 protrude from respective opposite sides of each of the vertical interconnects 114a, 114b, 114c. Further, a mounting portion adapted to mount a light emitting diode thereon is disposed between the interconnect extension 116 and the horizontal interconnect 112. In the illustrated exemplary embodiment, since two interconnect extensions 116 are provided to each vertical interconnect 114, two light emitting diode mounting portions are provided to each vertical interconnect 114. In this case, the light emitting diode mounting portion is disposed between the interconnect extension 116 and the horizontal interconnect 112.

Referring to FIG. 3, the horizontal interconnect 112 is horizontally disposed along a center line of the pixel P. The first to third vertical interconnects 114a, 114b, 114c are vertically disposed to be spaced apart from one another. In this case, the horizontal interconnect 112 is insulated from the first to third vertical interconnects 114a, 114b, 114c.

Interconnect extensions 116 protruding from respective opposite sides of the first vertical interconnect 114a are disposed at one side of the horizontal interconnect 112 to be separated from the horizontal interconnect 112 in a predetermined distance. For example, first and second blue chip mounting portions 122, 124 are disposed between the horizontal interconnect 112 and the respective interconnect extensions 116 of the first vertical interconnect 114a. Each of the first and second blue chip mounting portions 122, 124 partially extends over the horizontal interconnect 112 and a corresponding one of the interconnect extensions 116 of the first vertical interconnect 114a. Accordingly, as shown in FIG. 4, a blue light emitting diode chip 150 mounted on the first blue chip mounting portion 122 can be electrically connected to the horizontal interconnect 112 and a corresponding one of the interconnect extensions 116 of the first vertical interconnect 114a.

In addition, interconnect extensions 116 protruding from respective opposite sides of the second vertical interconnect 114b are disposed on the other side of the horizontal interconnect 112. Here, the other side of the horizontal interconnect 112 refers to a side opposite the side of the horizontal interconnect 112, at which the interconnect extensions 116 of the first vertical interconnect 114a are disposed. In addition, the interconnect extensions 116 of the second vertical interconnect 114b are separated from the horizontal interconnect in a predetermined distance. For example, first and second green chip mounting portions 132, 134 are disposed between the horizontal interconnect 112 and the respective interconnect extensions 116 of the second vertical interconnect 114b. Each of the first and second green chip mounting portions 132, 134 partially extends over the horizontal interconnect 112 and a corresponding one of the interconnect extensions 116 of the second vertical interconnect 114b. Accordingly, as shown in FIG. 4, a green light emitting diode chip 160 mounted on the first green chip mounting portion 132 can be electrically connected to the horizontal interconnect 112 and a corresponding one of the interconnect extensions 116 of the second vertical interconnect 114b.

Further, interconnect extensions protruding from respective opposite sides of the third vertical interconnect 114c are disposed at the one side of the horizontal interconnect 112. In addition, the interconnect extensions 116 of the third vertical interconnect 114c are separated from the horizontal interconnect 112 in a predetermined distance. For example, first and second red chip mounting portions 142, 144 are disposed between the horizontal interconnect 112 and the respective interconnect extensions 116 of the third vertical interconnect 114c. Each of the first and second green chip mounting portions 142, 144 partially extends over the horizontal interconnect 112 and a corresponding one of the interconnect extensions 116 of the third vertical interconnect 114c. Accordingly, as shown in FIG. 4, a red light emitting diode chip 170 mounted on the first green chip mounting portion 142 can be electrically connected to the horizontal interconnect 112 and a corresponding one of the interconnect extensions 116 of the third vertical interconnect 114c.

Here, the first and second blue chip mounting portions 122, 124 and the first and second red chip mounting portions 142, 144 are disposed at one side of the horizontal interconnect 112, and the first and second green chip mounting portions 132, 134 are disposed at the other side of the horizontal interconnect 112. In this manner, a space in the pixel P can be efficiently utilized.

Here, a space in which the first and second blue chip mounting portions 122, 124 are formed may correspond to a first sub-pixel, a space in which the first and second green chip mounting portions 142, 144 are formed may correspond to a second sub-pixel, and a space in which the first and second red chip mounting portions 132, 134 are formed may correspond to a third sub-pixel. In particular, one pixel P may include three sub-pixels that emit blue light, green light, and red light, respectively. In addition, each of the second blue chip mounting portion 124, the second green chip mounting portion 144, and the second red chip mounting portion 134 may be a spare mounting portion.

Although the horizontal interconnect 112, the first to third vertical interconnects 114a, 114b, 114c, and the interconnect extensions 116 are disposed on the substrate 110, as shown in FIG. 3 and FIG. 4, the horizontal interconnect 112, the first to third vertical interconnects 114a, 114b, 114c, and the interconnect extensions 116 may not be exposed to the outside.

Now, a vertical structure of the first and second blue chip mounting portions 122, 124 will be described with reference to FIG. 5.

Referring to FIG. 5, the first and second substrate electrodes 117a, 117b are disposed on the substrate 110. The insulating portion 118 is disposed between the first and second substrate electrodes 117a, 117b. The insulating portion 118 may prevent short-circuit between the first and second substrate electrodes 117a, 117b. Although not shown in FIG. 5, the insulating portion 118 may be further disposed on an upper side of each of the horizontal interconnect 112, the first to third vertical interconnects 114a, 114b 114c, and the interconnect extensions 116 on the substrate 110. In this manner, the horizontal interconnect 112, the first to third vertical interconnects 114a, 114b, 114c, and the interconnect extensions 116 can be protected from the outside environment by the insulating portion 118. In addition, the first substrate electrode 117a may be electrically connected to a corresponding one of the interconnect extensions 116 of the first vertical interconnect 114a, and the second substrate electrode 117b may be electrically connected to the horizontal interconnect 112.

The pair of first and second substrate electrodes 117a, 117b disposed as described above forms the first blue chip mounting portion 122, and the second blue chip mounting portion is formed at a side of the first blue chip mounting portion 122.

FIGS. 6A to 6D are views illustrating a process of mounting a light emitting diode chip on the substrate for the display of FIG. 2 and a process of repairing the display.

Figure 6A:
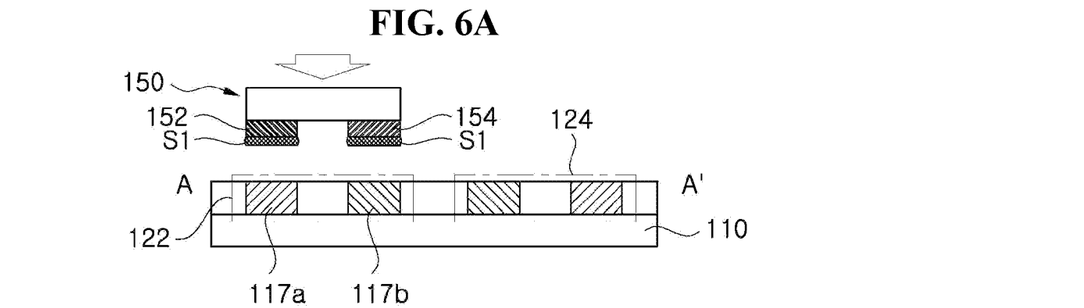
FIG. 6A, FIG. 6B, FIG. 6C, and FIG. 6D are views illustrating a process of mounting a light emitting diode chip on the substrate for the display of FIG. 1 and a process of repairing the display.
Figure 6B:
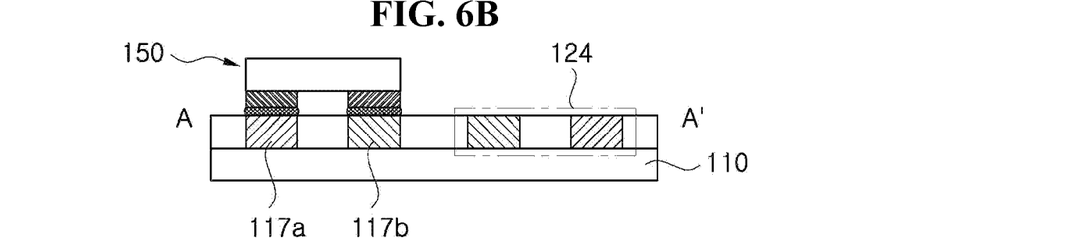
Figure 6C:
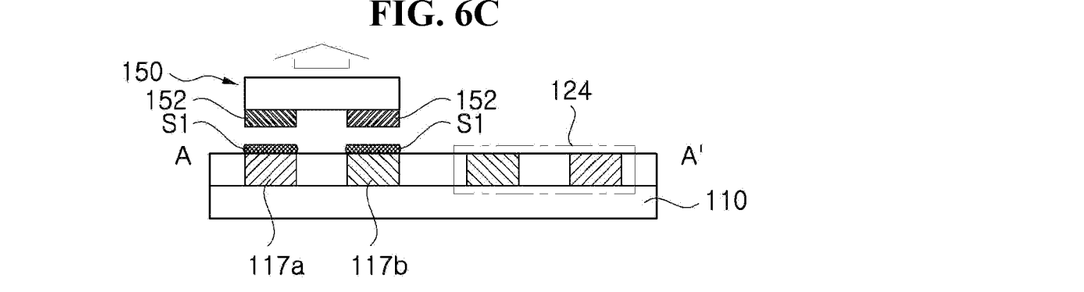
Figure 6D:
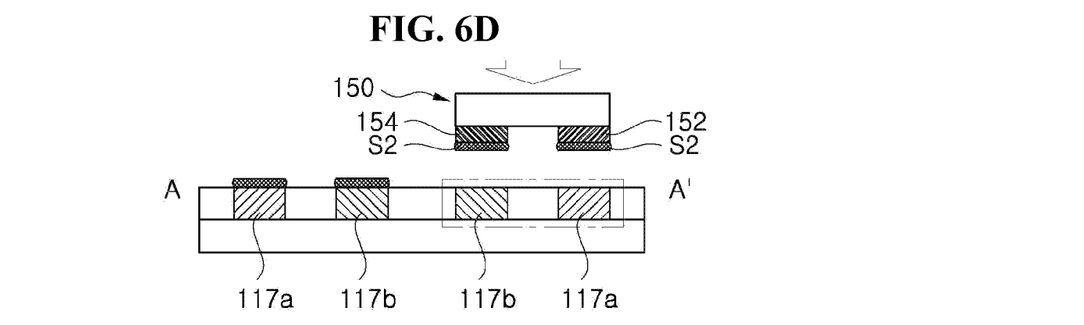

In FIGS. 6A and 6D, a process of mounting the blue light emitting diode chip 150 on the substrate 110 for the display 100 and a process of repairing the display will be exemplarily described.

Referring to FIG. 6A, the blue light emitting diode chip 150 is mounted on the first blue chip mounting portion 122 formed on the substrate 110. The blue light emitting diode chip 150 may include a light emitting structure, and first and second electrode pads 152, 154 formed on a lower side of the light emitting structure.

The light emitting structure may include an n-type semiconductor layer, an active layer, and a p-type semiconductor layer, in which each of the n-type semiconductor layer, the active layer, and the p-type semiconductor layer may include group III-V-based compound semiconductors. For example, each of the n-type semiconductor layer, the active layer, and the p-type semiconductor layer may include nitride semiconductors, such as (Al, Ga, In)N. The active layer may be interposed between the n-type semiconductor layer and the p-type semiconductor layer.

The n-type semiconductor layer may be a conductive semiconductor layer including an n-type dopant (for example, Si), and the p-type semiconductor layer may be a conductive semiconductor layer including a p-type dopant (for example, Mg). The active layer may include a multi quantum well (MQW) structure, in which a composition ratio of the active layer may be set such that the light emitting structure can emit light having a desired peak wavelength.

The composition ratio of the active layer of the blue light emitting diode chip 150 may be set, such that the blue light emitting diode chip emits light having a peak wavelength in the blue light band. Although the illustrated exemplary embodiment is described with reference to the blue light emitting diode chip 150, the inventive concepts are not limited thereto, and the green light emitting diode chip 160 or the red light emitting diode chip 170 may be used, besides the blue light emitting diode chip 150. In addition, a red light emitting diode package including the blue light emitting diode chip may be used, instead of the red light emitting diode chip 170, as needed. For example, the red light emitting diode package may include a phosphor portion covering the blue light emitting diode chip 150 and a color filter covering the phosphor portion. Here, the phosphor portion may include a phosphor adapted to convert wavelength of blue light emitted from the blue light emitting diode chip 150 to emit red light. The color filter serves to filter out light components in wavelength bands other than the red light band from light emitted through the phosphor portion.

In the illustrated exemplary embodiment, a first adhesive S1 may be applied to a lower surface of each of the first and second electrode pads 152, 154 of the blue light emitting diode chip 150.

With the first adhesive S1 applied to the first and second electrode pads 152, 154, the blue light emitting diode chip 150 is mounted on the first blue chip mounting portion 122 of the substrate 110, as shown in FIG. 6B. In this manner, the first electrode pad 152 is electrically connected to the first substrate electrode 117a, and the second electrode pad 154 is electrically connected to the second substrate electrode 117b. In this case, no light emitting diode chip is mounted on the second blue chip mounting portion 124.

When the blue light emitting diode chip 150 mounted on the first blue chip mounting portion 122 operates normally, the blue light emitting diode chip 150 is put into actual use. On the other hand, when the blue light emitting diode chip 150 mounted on the first blue chip mounting portion 122 fails to operate normally due to defects therein, the blue light emitting diode chip 150 may need to be removed. Accordingly, the blue light emitting diode chip 150 may be removed from the first blue chip mounting portion 122, as shown in FIG. 6C. In this case, some or all of the first adhesive S1 may be retained on the first blue chip mounting portion 122.

After removal of the blue light emitting diode chip 150 from the first blue chip mounting portion 122, a new blue light emitting diode chip 150 is mounted on the second blue chip mounting portion 124, as shown in FIG. 6D. In this case, a second adhesive S2 may be applied to the first and second electrode pads 152, 154 of the new blue light emitting diode chip 150 to be mounted on the second blue chip mounting portion 124. The second adhesive S2 may include different materials than those of the first adhesive S1. In the illustrated exemplary embodiment, the second adhesive S2 may have a lower melting point than that of the first adhesive S1.

When the second adhesive S2 has a lower melting point than the first adhesive S1, a light emitting diode chip already mounted in the same corresponding pixel P or in another neighboring pixel P can be prevented from falling off from the substrate 110 during in the process of mounting the new blue light emitting diode chip 150 on the second blue chip mounting portion 124. As described above, existing light emitting diode chips in the same corresponding pixel P or in other neighboring pixels P are mounted on the substrate 110 using the first adhesive S1. Accordingly, the usage of the second adhesive S2 having a lower melting point than that of the first adhesive S1 to mount the new blue light emitting diode chip 150 on the second blue chip mounting portion 124 can prevent the first adhesive S1 from melting.

In the illustrated exemplary embodiment, each of the first and second adhesives S1, S2 may include one selected from the group of AuSn, AgSn, Sn, InAu, and In, so long as the melting point of the second adhesive S2 is lower than that of the first adhesive S1.

Further, in the illustrated exemplary embodiment, electrical disconnection of the defective blue light emitting diode chip 150 from the first blue chip mounting portion 122 by cutting the interconnect extension 116 electrically connected to the first blue chip mounting portion 122 may also be employed, instead of removing the defective blue light emitting diode chip 150 from the first blue chip mounting portion 122.

FIGS. 7A to 7D are views illustrating a process of mounting a light emitting diode chip on a substrate for a display according to a second exemplary embodiment and a process of repairing the display.

A process of mounting a light emitting diode chip on the substrate 110 for the display 100 according to the second exemplary embodiment and a process of repairing the display will be described with reference to FIGS. 7A to 7D.

Figure 7A:
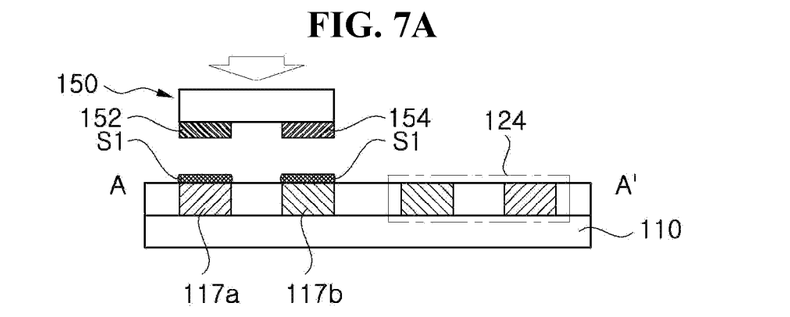
FIG. 7A, FIG. 7B, FIG. 7C, and FIG. 7D are views illustrating a process of mounting a light emitting diode chip on a substrate for a display according to a second exemplary embodiment and a process of repairing the display.

Referring to FIG. 7A, the blue light emitting diode chip 150 is mounted on the first blue chip mounting portion 122 formed on the substrate 110. Here, unlike in the first exemplary embodiment, a first adhesive S1 is applied to the first and second substrate electrodes 117a, 117b of the substrate 110. Accordingly, the blue light emitting diode chip 150 is mounted on the first blue chip mounting portion 122 after melting the first adhesive S1 applied to the first and second substrate electrodes 117a, 117b.

Figure 7B:
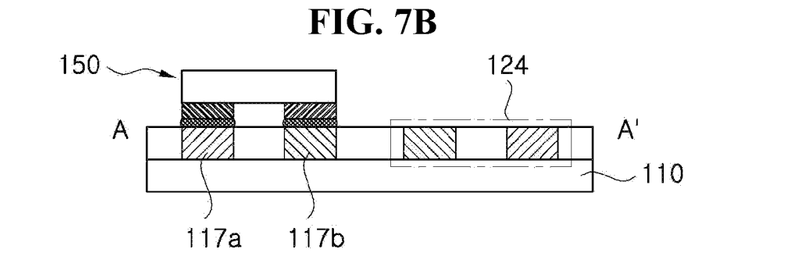

Accordingly, as shown in FIG. 7B, the blue light emitting diode chip 150 is mounted on the first blue chip mounting portion 122, and no light emitting diode chip is mounted on the second blue chip mounting portion 124.

Figure 7C:
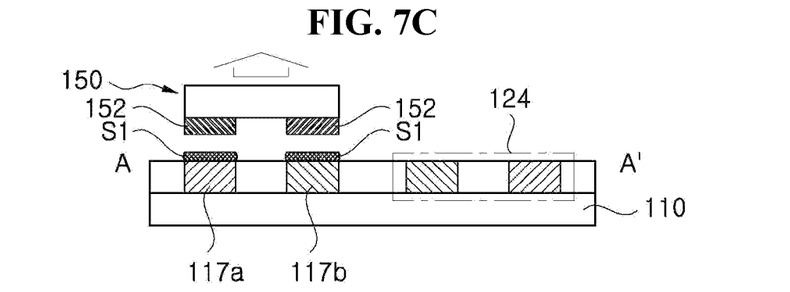
Figure 7D:
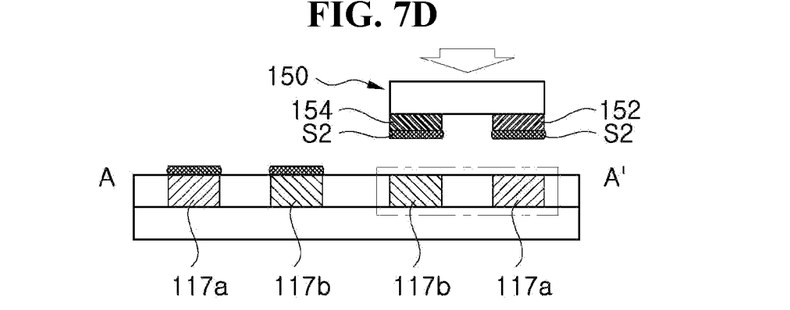

When the blue light emitting diode chip 150 mounted on the first blue chip mounting portion 122 operates normally, the blue light emitting diode chip 150 is put into actual use. When the blue light emitting diode chip 150 fails to operate normally, the blue light emitting diode chip 150 is removed, as shown in FIG. 7C. Then, a new blue light emitting diode chip 150 with a second adhesive S2 applied to the first and second electrode pads 152, 154 thereof is mounted on the second blue chip mounting portion 124, as shown in FIG. 7D.

Since the first and second adhesives S1, S2 are the same as those described in the first exemplary embodiment, repeated descriptions thereof will be omitted.

Figure 8:
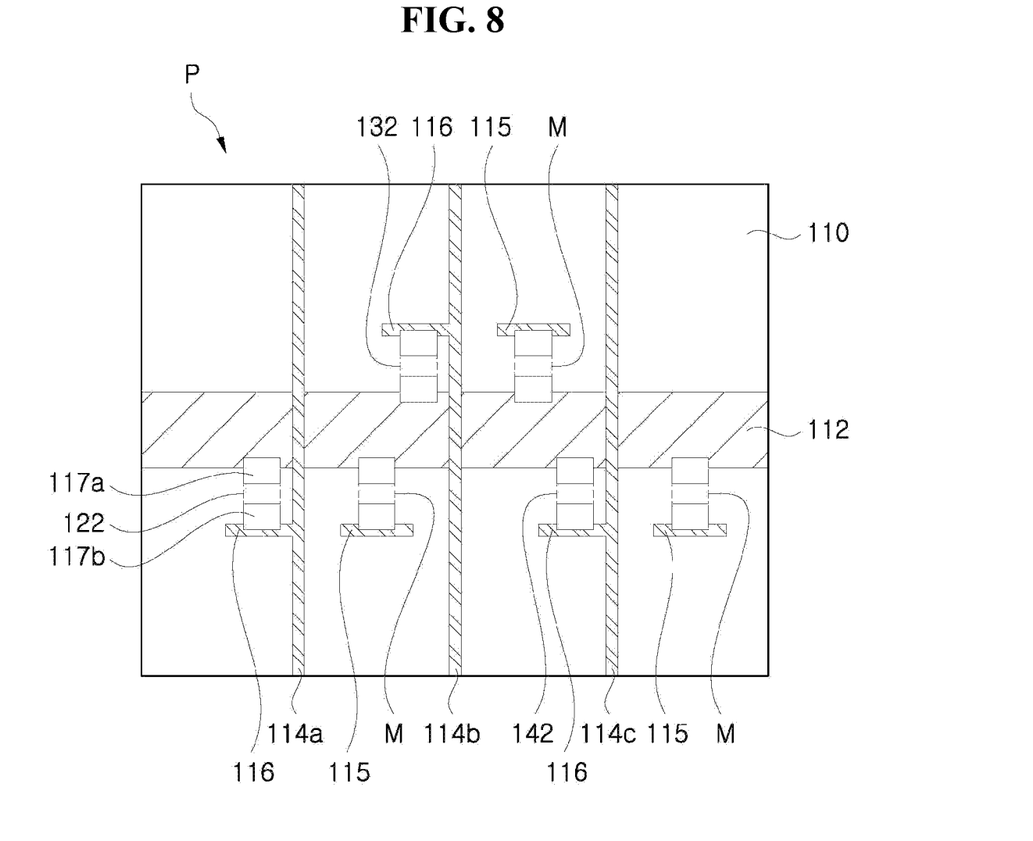
FIG. 8 is a plan view of one pixel of a substrate for a display according to a third exemplary embodiment.
Figure 9:
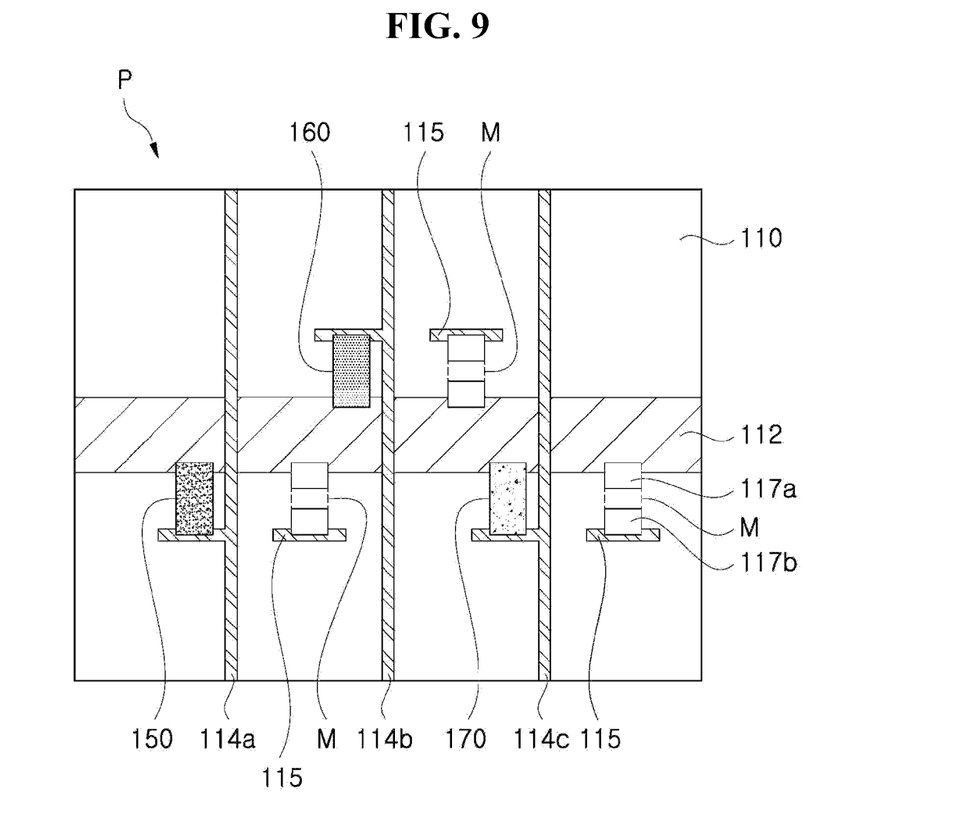
FIG. 9 is a plan view of the substrate for the display of FIG. 8, with light emitting diode chips mounted thereon.
Figure 10:
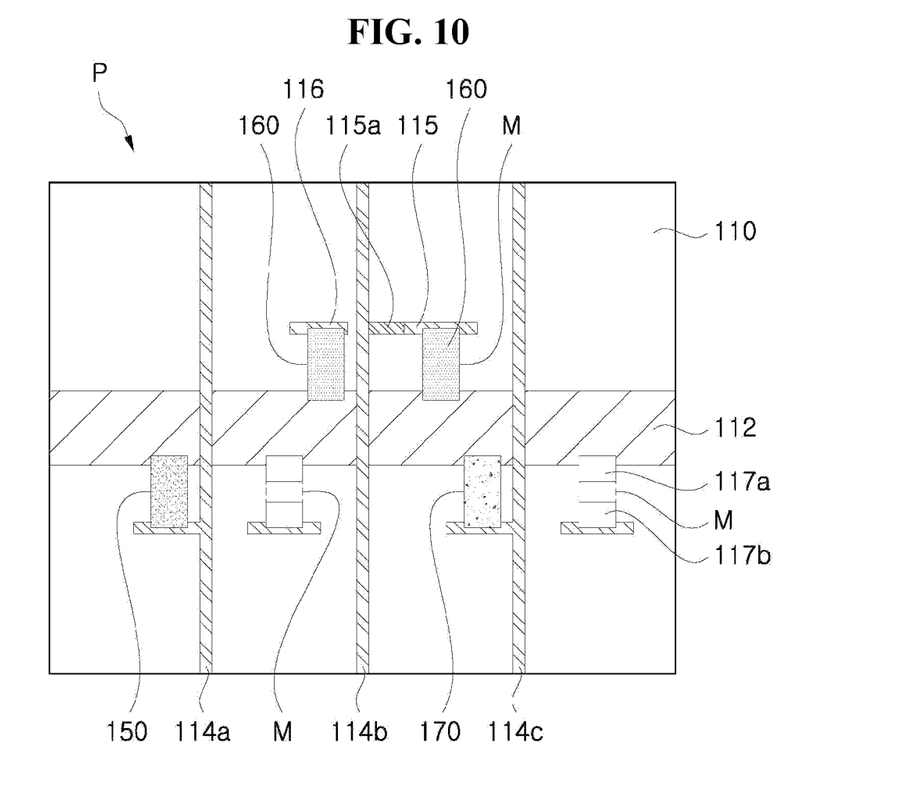
FIG. 10 is a plan view of the substrate for the display of FIG. 8 including a repaired light emitting diode chip.

FIG. 8 is a plan view of one pixel of a substrate for a display according to a third exemplary embodiment. FIG. 9 is a plan view of the substrate for the display of FIG. 8, with light emitting diode chips mounted thereon. FIG. 10 is a plan view illustrating a state in which one of the light emitting diode chips on the substrate of FIG. 8 is repaired.

Referring to FIG. 8, a substrate 110 for a display 100 according to the third exemplary embodiment may include horizontal interconnects 112, vertical interconnects 114, interconnect extensions 116, and first substrate electrodes 117a, second substrate electrodes 117b, and insulating portions. FIG. 8 exemplarily shows one of the pixels formed on the substrate 110.

The pixel according to the illustrated exemplary embodiment has a configuration similar to that illustrated in the first exemplary embodiment, and thus, repeated descriptions of the same elements already described above in the first exemplary embodiment will be omitted.

Referring to FIG. 8, one horizontal interconnect 112 and three vertical interconnects 114a, 114b, 114c are disposed in one pixel. Each of the vertical interconnects 114a, 114b, 114c has one interconnect extension 116 protruding from one side thereof. A mounting portion adapted to mount a light emitting diode thereon is disposed between the interconnect extension 116 and the horizontal interconnect 112. Although the interconnect extension 116 is illustrated as being formed at the left of each of the three vertical interconnects 114a, 114b, 114c, however, the inventive concepts are not limited thereto, and in some exemplary embodiments, the interconnect extension 116 may be formed at the right side of each of the three vertical interconnects 114a, 114b, 114c. Alternatively, some interconnect extensions 116 may each be formed at the left of a corresponding one of the vertical interconnects 114a, 114b, 114c, and the other interconnect extensions 116 may each be formed on the right of a corresponding one of the vertical interconnects 114a, 114b, 114c.

In addition, a disconnected interconnect 115 may be disposed in each interval of the three vertical interconnects 114a, 114b, 114c. In an exemplary embodiment, the disconnected interconnect 115 may be disposed in the middle of each interval of the vertical interconnects 114a, 114b, 114c, without being limited thereto. Further, the disconnected interconnect 115 may be disposed at the same vertical location as a corresponding interconnect extension 116. More particular, the disconnected interconnect 115 may be located in a line extending from the corresponding interconnect extension in a longitudinal direction thereof. However, the inventive concepts are not limited thereto, and the vertical position of the disconnected interconnect 115 may be determined regardless of the vertical position of the corresponding interconnect extension 116.

In addition, the disconnected interconnect 115 may be spaced apart from vertical interconnects 114a, 114b, or 114c located at both sides thereof. More particularly, the disconnected interconnect 115 may be electrically separated from the vertical interconnects 114a, 114b, 114c.

The disconnected interconnect 115 is separated from the horizontal interconnect 112 in a predetermined distance, and a spare mounting portion M adapted to mount a light emitting diode thereon may be disposed between the disconnected interconnect 115 and the horizontal interconnect 112. The spare mounting portion M may partially extend over each of the disconnected interconnect 115 and the horizontal interconnect 112.

More particularly, the first blue chip mounting portion 122 and one spare mounting portion M may be disposed at respective opposite sides with respect to the first vertical interconnect 114a. In addition, the first green chip mounting portion 132 and one spare mounting portion M may be disposed at respective opposite sides with respect to the second vertical interconnect 114b. Further, the first red chip mounting portion 142 and the spare mounting portion M may be disposed at respective opposite sides with respect to the third vertical interconnect 114c.

Accordingly, a blue light emitting diode chip 150 may be mounted on the first blue chip mounting portion 122, a green light emitting diode chip 160 may be mounted on the first green chip mounting portion 132, and a red light emitting diode chip 170 may be mounted on the first red chip mounting portion 122, as shown in FIG. 9.

For example, if a problem occurs in the green light emitting diode chip 160 mounted on the first green chip mounting portion 132, a new green light emitting diode chip 160 may be mounted on the spare mounting portion M adjacent to the first green chip mounting portion 132, as shown in FIG. 10.

In order to prevent operation of the problematic green light emitting diode chip 160, an interconnect extension 116 electrically connected to the first green chip mounting portion 132 is electrically disconnected from the second vertical interconnect 114b. In this case, the interconnect extension 116 may be electrically disconnected from the second vertical interconnect 114b by cutting a portion of the interconnect extension 116. Further, an interconnect connection 115a may be formed between the disconnected interconnect 115 and the second vertical interconnect 114b to electrically connect the disconnected interconnect 115 to the second vertical interconnect 114b. The interconnect connection 115a may be formed, for example, by depositing indium tin oxide (ITO) on the substrate 110, forming a plating layer on the substrate, or using a bonding wire. However, the inventive concepts are not limited thereto, and the second vertical interconnect 114b and the disconnected interconnect 115 may be electrically connected to each other in various other ways.

In the illustrated exemplary embodiment, the new green light emitting diode chip 160 is described as being mounted on the spare mounting portion M disposed at the right of the first green chip mounting portion 132, as shown in FIG. 10. However, the inventive concepts are not limited thereto, and the new green light emitting diode chip 160 may be mounted on the spare mounting portion M disposed at the right of the first blue chip mounting portion 122, as needed.

As described above, the spare mounting portion M electrically separated from the vertical interconnects 114a, 114b, 114c may be electrically connected to a selected one of the vertical interconnects 114a, 114b, 114c through the repair process. For example, a new blue light emitting diode chip 150 or a new green light emitting diode chip 160 may be mounted on the spare mounting portion M disposed between the first vertical interconnect 114a and the second vertical interconnect 114b, and a new green light emitting diode chip 160 or a new red light emitting diode chip 170 may be mounted on the spare mounting portion M between the second vertical interconnect 114b and the third vertical interconnect 114c. In this manner, one spare mounting portion M may be used to repair one defective light emitting diode chip among two different types of light emitting diode chips, as needed.

The spare mounting portion M disposed at the right of the second vertical interconnect 114b may be used to mount a new red light emitting diode chip 170 thereon. Although the spare mounting portion M disposed at the right of the second vertical interconnect 114b is shown as spaced apart from the third vertical interconnect 114c in the illustrated exemplary embodiment, the spare mounting portion M disposed at the right of the second vertical interconnect may be electrically connected to the third vertical interconnect 114c, as needed. More particularly, in a sub-pixel region at the right of the second vertical interconnect 114b, the interconnect extension 116 may be disposed, instead of the disconnected interconnect 115.

Further, although a sub-pixel region at the upper left of the first vertical interconnect 114a and a sub-pixel region at the upper right of the third vertical interconnect 114c are shown as being empty without any spare mounting portion M, the inventive concepts are not limited thereto, and a spare mounting portion M as described above may also be disposed in these sub-pixel regions. For example, a spare mounting portion adapted to mount the blue light emitting diode chip 150 thereon may be disposed in the sub-pixel region at the upper left of the first vertical interconnect 114a, and a spare mounting portion adapted to mount the red light emitting diode chip 170 thereon may be disposed in the sub-pixel region at the upper right of the third vertical interconnect 114c. In addition, a disconnected interconnect 115 or an interconnect extension 116 as described above may be disposed in these sub-pixel regions.

In this manner, a larger number of sites for mounting of a separate light emitting diode chip may be provided than the above described exemplary embodiments. Furthermore, according to this exemplary embodiment, one spare mounting portion is adapted to mount any of two different types of light emitting diode chips thereon, thereby allowing flexible repair options.

According to the exemplary embodiments, since the defective light emitting diode chip only needs to be electrically disconnected from other components without being removed, repairing time can be shortened.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display, comprising:
    a base;
    a plurality of pixels disposed on the base in rows and columns, at least one of the pixels including a first interconnect and a plurality of second interconnects; and
    a plurality of mounting portions on which a plurality of sub-pixels is to be mounted,
    wherein:
    a first portion of each of the plurality of mounting portions is electrically connected to the first interconnect;
    a second portion of each of the plurality of mounting portions is electrically connected to one of the second interconnects; and at least one of the plurality of sub-pixels mounted on the plurality of mounting portions is configured to emit light of different wavelength.

2. The display according to claim 1, further comprising an interconnect extension disposed on the base and extending from the corresponding second interconnect,
wherein the mounting portions are disposed between the first interconnect and the interconnect extension.

3. The display according to claim 2, wherein:
the interconnect extension includes a first interconnect extension extending in a first direction from the corresponding second interconnect and a second interconnect extension extending in a second direction from the corresponding second interconnect;
the mounting portions include a first mounting portion between the first interconnect extension and the first interconnect and a second mounting portion between the second interconnect extension and the first interconnect;
the second mounting portion is symmetrical to the first mounting portion with respect to the second interconnect; and
the second mounting portion is configured to mount a spare sub-pixel thereon.

4. The display according to claim 3, wherein the first interconnect extension and the second interconnect extension protrude from the second interconnect.

5. The display according to claim 3, wherein when the sub-pixel mounted on the first mounting portion is defective, the spare sub-pixel mounted on the second mounting portion is configured to replace the defective sub-pixel on the first mounting portion.

6. The display according to claim 3, wherein:
the first interconnect extension protrudes from the second interconnect; and
the second interconnect extension is spaced apart from the second interconnect.

7. The display according to claim 6, further comprising an interconnect connection connecting the second interconnect to the second interconnect extension.

8. The display according to claim 7, wherein the interconnect connection comprises at least one of an indium tin oxide (ITO), a plating layer, and a bonding wire.

9. The display according to claim 7, wherein when the sub-pixel mounted on the first mounting portion is defective, the defective sub-pixel mounted on the first mounting portion is configured to be electrically disconnected from the corresponding second interconnect.

10. The display according to claim 5, wherein the spare sub-pixel mounted the second mounting portion is configured to emit light of the same wavelength as the sub-pixel mounted the first mounting portion adjacent to the second mounting portion.

11. The display according to claim 1, wherein:
the sub-pixel includes a light emitting structure, a first electrode pad, and a second electrode pad;
the light emitting structure includes an n-type semiconductor layer, a p-type semiconductor layer, and an active layer disposed between the n-type semiconductor layer and the p-type semiconductor layer;
the first electrode pad and the second electrode pad are disposed on a lower surface or an upper surface of the light emitting structure; and
the first electrode pad is electrically connected to the n-type semiconductor layer, and the second electrode pad electrically connected to the p-type semiconductor layer.

12. The display according to claim 3, further comprising an adhesive to couple the sub-pixel to the mounting portion.

13. The display according to claim 12, wherein the adhesive comprises at least one selected from the group of AuSn, AgSn, Sn, InAu, and In.

14. The display according to claim 12, wherein:
the adhesive includes a first adhesive to bond the sub-pixel to the first mounting portion and a second adhesive to bond the spare sub-pixel to the second mounting portion; and
the second adhesive has a lower melting point than the first adhesive.

15. The display according to claim 2, wherein the mounting portion further includes a first substrate electrode electrically connected to the first interconnect and a second substrate electrode electrically connected to the interconnect extension.

* * * * *